(12) United States Patent
Belnap

(10) Patent No.: US 12,421,120 B2
(45) Date of Patent: Sep. 23, 2025

(54) NANODIAMOND WITH VACANCY DEFECT AND QUANTUM DOT LUMINESCENCE

(71) Applicant: Schlumberger Technology Corporation, Sugar Land, TX (US)

(72) Inventor: J. Daniel Belnap, Provo, UT (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 18/851,223

(22) PCT Filed: Jun. 15, 2023

(86) PCT No.: PCT/US2023/068502
§ 371 (c)(1),
(2) Date: Sep. 26, 2024

(87) PCT Pub. No.: WO2023/245111
PCT Pub. Date: Dec. 21, 2023

(65) Prior Publication Data
US 2025/0162877 A1    May 22, 2025

Related U.S. Application Data

(60) Provisional application No. 63/366,434, filed on Jun. 15, 2022.

(51) Int. Cl.
*C01B 32/28*    (2017.01)
*B01J 3/06*    (2006.01)
*C09K 11/65*    (2006.01)

(52) U.S. Cl.
CPC .............. *C01B 32/28* (2017.08); *B01J 3/065* (2013.01); *C09K 11/65* (2013.01); *B01J 2203/0655* (2013.01); *C01P 2006/60* (2013.01)

(58) Field of Classification Search
None
See application file for complete search history.

(56) References Cited

U.S. PATENT DOCUMENTS 8,168,413 B2    5/2012    Chang et al.
10,287,495 B1    5/2019    Shenderova
(Continued)

FOREIGN PATENT DOCUMENTS

KR    10-0687773 B1    2/2007
KR    10-1494251 B2    2/2015
(Continued)

OTHER PUBLICATIONS

Shenderova, O. et al., "Carbon-Dot-Decorated Nanodiamonds", Particle Particle Systems Characterization, 2014, vol. 31, No. 5, pp. 580-590.
(Continued)

*Primary Examiner* — Guinever S Gregorio
(74) *Attorney, Agent, or Firm* — Jeffrey D. Frantz

(57) ABSTRACT

Luminescent diamond is made by subjecting a volume of diamond grains to high-pressure/high-temperature conditions with or without a catalyst or pressure transfer media to cause the grains to undergo plastic deformation to produce internal vacancy defects, increasing the luminescent activity/intensity of the resulting diamond material. The luminescent material is then subjected to further treatment to create quantum dots on the surface of the diamond particles. Quantum dot formation can include placing the diamond particles in liquid and subjecting the particles to laser pulses. The consolidated diamond material may be treated to further increase luminescent activity/intensity including reducing the consolidated diamond material to diamond particles, heat treatment in vacuum, and/or air heat treatment. The resulting luminescent diamond particles display a level of luminescence intensity greater than that of conventional
(Continued)

luminescent nanodiamond, and may be functionalized for use in biological applications.

12 Claims, 1 Drawing Sheet

(56) References Cited

U.S. PATENT DOCUMENTS

| | | | |
|---|---|---|---|
| 2013/0266678 A1* | 10/2013 | Bao | B01J 3/067 |
| | | | 425/77 |
| 2014/0065424 A1 | 3/2014 | Boudou | |
| 2017/0088427 A1* | 3/2017 | Liang | B23K 26/0853 |
| 2017/0275950 A1* | 9/2017 | Spencer | C23C 14/5813 |
| 2017/0373153 A1* | 12/2017 | Narayan | H10D 62/812 |
| 2019/0282984 A1* | 9/2019 | Stroud | C01B 32/26 |
| 2020/0179888 A1* | 6/2020 | Vila Anton | B01J 23/72 |
| 2022/0056337 A1* | 2/2022 | Belnap | C01B 32/28 |
| 2023/0257648 A1* | 8/2023 | Bao | C09K 11/65 |
| | | | 252/301.4 F |

FOREIGN PATENT DOCUMENTS

| | | | |
|---|---|---|---|
| WO | 0172405 A1 | 10/2001 | |
| WO | 2008138841 A1 | 11/2008 | |
| WO | WO-2020150341 A1 * | 7/2020 | B01J 3/06 |
| WO | 2023107602 A2 | 6/2023 | |
| WO | 2023230329 A1 | 11/2023 | |
| WO | 2023245112 A1 | 12/2023 | |

OTHER PUBLICATIONS

Gong, J. et al., "Nanodiamond-based nanostructures for coupling nitrogen-vacancy centres to metal nanoparticles and semiconductor quantum dots", Nature communications, 2016, vol. 7, Article No. 11820, pp. 1-10.

Cui et al., "Synthesis of Homogeneous Carbon Quantum Dots by Ultrafast Dual Beam Pulsed Laser Ablation for Bioimaging", Materials Today Nano, 12 (2020), 100091, 9 pages.

Astafiev et al., "Femtosecond Laser Synthesis of Luminescent Carbon Dots from Toluene", JETP Letters, vol. 110, pp. 464-471 (2019).

Lingling et al., Focusing on Luminescent Graphene Quantum Dots: Current Status and Future Perspectives, Nanoscale vol. 5, Issue 10, pp. 4015-4039, May 21, 2013.

International Search Report and Written Opinion issued in International Patent Appl. No. PCT/US2023/068502 on Oct. 12, 2023; 10 pages.

* cited by examiner

NANODIAMOND WITH VACANCY DEFECT AND QUANTUM DOT LUMINESCENCE

CROSS REFERENCE TO RELATED APPLICATIONS

This application is the National Stage Entry of International Application No. PCT/US2023/068502, filed Jun. 15, 2023, which claims the benefit of U.S. Provisional Application No. 63/366,434, entitled "NANODIAMOND WITH VACANCY DEFECT AND QUANTUM DOT LUMINESCENCE," filed Jun. 15, 2022. Each of the above disclosures is hereby incorporated herein by reference.

BACKGROUND

Laser-infused fluorescence is a known technique adopted for better understanding how biological systems function at a molecular level through the probing of biomolecules individually for observation. In an example, laser-infused fluorescence may be applied to image and track a single molecule or particle in a biological cell or the like, e.g., in-vivo biological sensors for internal organ mapping, cell imaging, and the like. One type of substance used for laser-infused fluorescence is luminescent nanodiamond, which are nano-sized diamond particles or grains that has been developed to emit light when excited by a light source within a desired wavelength as called for by the end-use application.

BRIEF DESCRIPTION OF THE DRAWINGS

These and other features and advantages of luminescent nanodiamond and methods of making the same as disclosed herein will be appreciated as the same becomes better understood by reference to the following detailed description when considered in connection with the accompanying drawings where.

DETAILED DESCRIPTION

Figure 1:
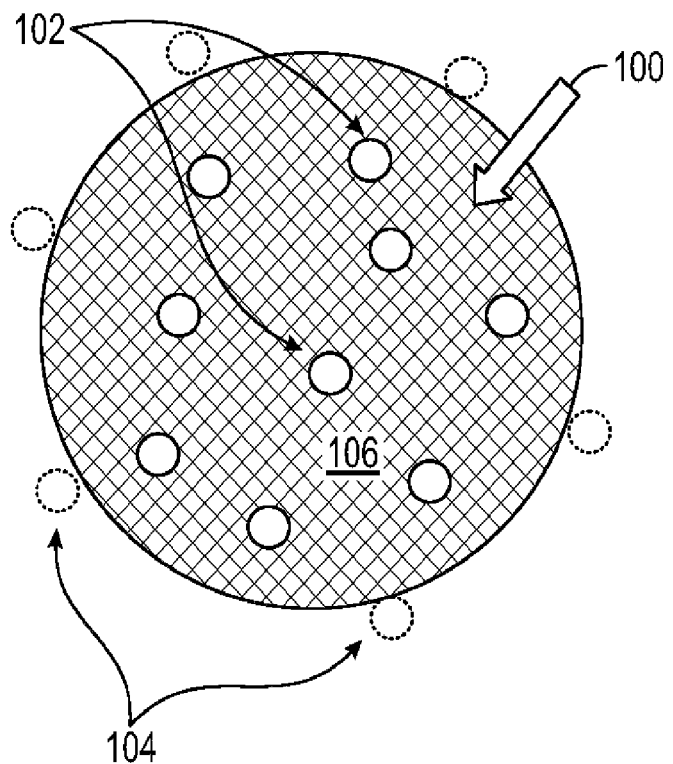
FIG. 1 is a schematic illustration of a diamond nanoparticle having nitrogen vacancy centers and quantum dot luminescence locations, according to embodiments of the present disclosure.

In some embodiments, luminescent diamond (e.g., photoluminescent diamond) and methods for making the same as disclosed herein is engineered in a manner that increases luminescence and functional utility of the nanodiamond. Luminescent diamond as prepared in accordance with the principles disclosed herein can display a level of luminescence intensity that is similar to or greater than that of conventional luminescent diamond, to thereby present an opportunity for expanding the range of potential end-use applications for such material. In some embodiments, luminescent diamond is formed initially by consolidation and compaction of pre-existing diamond grains, forming a luminescent active sintered body or slug (characterized by a high degree of intercrystalline diamond bonding), or forming a mechanically combined semi-sintered body or slug (characterized by substantially no intercrystalline diamond bonding). In such condition, the consolidated material may be referred to as luminescent diamond. During a subsequent procedure the luminescent diamond can be reduced in size as called for by a particular end use, and in some embodiments, the resulting diamond particles or grains are nano-scale in size. In some embodiments, the reduced sized luminescent diamond may be exclusively nano-size particles or may include a combination of nano-size particles with coarser diamond particles. The term "nanodiamond" as used herein is understood to refer to luminescent diamond including nano-size diamond particles, i.e., having an average size between about 1 to 1000 nm.

In further embodiments, the compacted and consolidated diamond—either before or after reductions in particle size—can also be modified to produce luminescence centers on the surfaces of these materials using a process such as laser irradiation. The laser irradiation may follow a so-called quantum carbon dot approach, in which carbon-based materials can produce luminescence. Creation of quantum carbon dots can include subjecting the nitrogen vacancy containing compacted and consolidated diamond materials to high energy laser pulses. These laser pulses create active luminescent centers on the surface of the nanodiamond, while the nitrogen vacancy centers are dispersed throughout the interior (and potentially surface) of the nanodiamond. The quantity and size of the quantum dots, along with the parameters of the laser treatment, can provide additive luminescence intensity benefits beyond those produced exclusively by either nitrogen vacancy centers or quantum carbon dots.

In some embodiments, luminescent diamond as disclosed herein may be formed by combining a volume of precursor diamond grains, which may be in the form of natural and/or synthetic diamond grains, and placing the volume of diamond grains into a can or container as conventionally used for diamond grain consolidation. In some embodiments, the diamond grains may have an average grain size of from about 1 to 1000 µm, from about 1 to 100 µm, or from about 10 to 50 µm. In other embodiments, the initial diamond grain or powder sizes may extend into the submicron or nanodiamond range. In some embodiments, nanosized powders formed either by mechanical crushing of conventional diamond powders or detonation processes can be employed in a similar manner.

Conventional diamond powders can either be of synthetic or natural origin; however, synthetic diamond powder generally has a higher intrinsic nitrogen content, which, along with an adjacent vacancy, makes the diamond luminescent active. In some embodiments, it is desired that the starting diamond material have an intrinsic amount of nitrogen impurity that is consistent with that found in diamond designated as type 1b, e.g., about 50 ppm nitrogen or higher. Nanosized powders synthesized through shock synthesis generally have higher intrinsic nitrogen content as well. In some embodiments, the container and its contents are subjected to a high-pressure/high-temperature (HPHT) consolidation process using conventional press equipment for making polycrystalline diamond. In some embodiments, the volume of diamond grains is placed into the can or container. The can or container may or may not be sealed, is placed within a HPHT press, and then subjected to desired sintering pressure and temperature conditions.

In some embodiments, the HPHT process temperature may be in the range of from about 1300 to 2500° C., and the process pressure may be from about 3.0 GPa to about 10 GPa. In some embodiments, the volume of diamond grains is substantially free of any catalyst material, so that diamond material resulting from the HPHT process is not fully sintered, but rather is in the form of a semi-sintered slug or body including diamond grains that are mechanically combined together by frictional contact, cold welding, diamond self-diffusion and the like. In some embodiments, producing a diamond material that is not fully sintered (i.e., that is semi-sintered and not characterized by a network of bonded-together diamond grains making use of a conventional metal solvent catalyst), the relative transparency of the same as contrasted with a sintered polycrystalline diamond body is improved. The transparency of the diamond material may improve the intensity of luminescent emission therefrom. There may also be graphite that forms in the porous regions of the semi-sintered body, which may decrease the intensity of the luminescence. In such case it is desired that the graphitic material be partially or completely removed as part of the manufacturing process.

During the HPHT process, it has been discovered that at least a portion of the volume of precursor diamond grains undergoes plastic deformation. In some embodiments, the extent of the HPHT consolidation process is such to cause sufficient plastic deformation in the diamond grains to create nitrogen vacancy (N—V and/or N—V—N) defects and/or N3 optical centers in the diamond grains that operate to make the diamond grains luminescent active. Plastic deformation of diamond particles during HPHT is believed to create vacancies as deformation mechanisms such as crystallographic dislocation motions become active. The vacancies can in turn combine with nitrogen impurities to form the nitrogen vacancy (N—V and/or N—V—N) defects and/or N3 optical centers which create the desired luminescent activity. In some embodiments, this occurs during conventional sintering of polycrystalline diamond with metal catalysts (such as cobalt that function to promote intercrystalline diamond bonding during the HPHT process) or non-metal catalysts/pressure transfer media (such as carbonates and chlorides that do not promote intercrystalline diamond bonding during the HPHT process). In some embodiments, the diamond grains resulting from the HPHT process may be heavily plastically deformed with extensive N—V and/or N—V—N defects and/or N3 optical centers, and weak diamond-diamond bonding in comparison to solvent catalyst bonded polycrystalline diamond. For example, in some embodiments, it is desired that the diamond grains incur such plastic deformation giving rise to luminescent activity during the HPHT process without resulting in a fully-sintered body. Through avoiding a fully-sintered body, the downstream process of sizing the diamond grains, by a crushing process or the like, is made easier and less energy intensive, as only breaking apart mechanically combined diamond grains is required.

In some embodiments, luminescent diamond as disclosed herein may be formed in a similar manner, by subjecting a volume of diamond or other superhard precursor grains to an HPHT process with the precursor material having an intrinsic amount of silicon impurities. In such case, the luminescent diamond may be formed with silicon vacancies and optical centers that operate to make the diamond grains luminescent active. Other impurities that may produce vacancies that create luminescence in suitable spectra (e.g., visible, ultraviolet, infrared, near-infrared, etc.) may also be used.

In some embodiments, luminescent diamond as disclosed herein may be formed in a similar manner, by subjecting a volume of diamond precursor grains to an HPHT process in the presence of a catalyst material. In such embodiments, the type of catalyst materials used may be selected from the group including and not limited to Co, Fe, Ni, carbonates, Si and combinations thereof for forming polycrystalline diamond (PCD). In some embodiments, HPHT processing conditions for cobalt PCD may be within a temperature of from about 1300 to 1500° C. and pressures from about 5.0 to 7.5 GPa. In addition, cobalt PCD is typically heat treated in vacuum at temperatures of 600 to 700° C. (e.g., after PCD formation, before and/or after sizing). The amount of the catalyst material used can and will vary depending on such factors as the type of catalyst used, the amount of luminescence desired, and the particular end-use application.

In biological end-use applications, for biocompatibility reasons, the presence of a metal material in the luminescent diamond may not be desired and/or permitted, in which case it may be desired to use a non-metallic catalyst. In some embodiments, using a non-metallic catalyst results in a PCD body having relatively higher transparency or reduced opacity when compared to PCD formed using a metal solvent catalyst. In some embodiments, non-metallic catalysts useful for making luminescent diamond as disclosed herein include carbonate catalysts such as magnesium carbonate, calcium carbonate, or the like, resulting in the formation of carbonate PCD (CPCD). In some embodiments, the amount of such carbonate catalyst may be an amount sufficient to form a completely sintered carbonate PCD body, e.g., up to about 5 percent by weight based on the total weight of the carbonate catalyst and the diamond grains. Carbonate PCD appears to be intrinsically less dark/more transparent than cobalt PCD, which is believed to contribute to a higher level of luminescent emission and intensity. In some embodiments, HPHT processing of carbonate PCD may be at temperatures of from about 1700 to 3000° C. and greater than about 7.0 GPa pressure. In addition, carbonate PCD may be heat treated in an inert or vacuum environment to temperatures of about 500 to 1300° C. (e.g., after CPCD formation, before and/or after sizing). As with embodiments described earlier, HPHT processing of CPCD produces plastic deformations in the diamond grains creating vacancies or optical centers (e.g., nitrogen, silicon, etc.) that give rise to an increased level of luminescent activity/intensity as compared to the precursor diamond grains. Some vacancies formed during HPHT may not combine with nitrogen, silicon, or other impurities during the plastic deformation process and may migrate adjacent to sites during heat treatment, creating additional vacancies or optical sites. The higher processing temperature and pressure conditions involved with carbonate PCD may produce a higher degree of plastic deformation in the diamond grains, and therefore produce higher luminescence activity. The use of higher heat treating temperatures may also contribute to additional defect or optical center generation, and therefore higher luminescent activity.

FIG. 1 schematically illustrates a diamond nanoparticle 100 that may provide luminescence from vacancies 102, surface quantum dots 104, or a combination thereof. In particular, the nitrogen, silicon, or other vacancies or optical centers may be dispersed throughout the body 106 of the diamond nanoparticle 100. Additionally, or alternatively, quantum dots 104 may be formed on the surface of the body 106 of the diamond nanoparticle.

This hybrid approach of including both vacancies/optical centers and quantum dots may be used to increase luminescence. For instance, luminescent nanodiamond may lose significant intensity as particles get smaller. For instance, particle sizes less than 100 nm, less than 50 nm, or less than 35 nm may have a need for higher luminescence intensity in some applications, and may benefit from multiple types of luminescence. Having luminescence from two, independent mechanisms may therefore have the potential to add to the overall intensity of a nanoparticle and make it more visible in a biological or other application.

Figure 2:
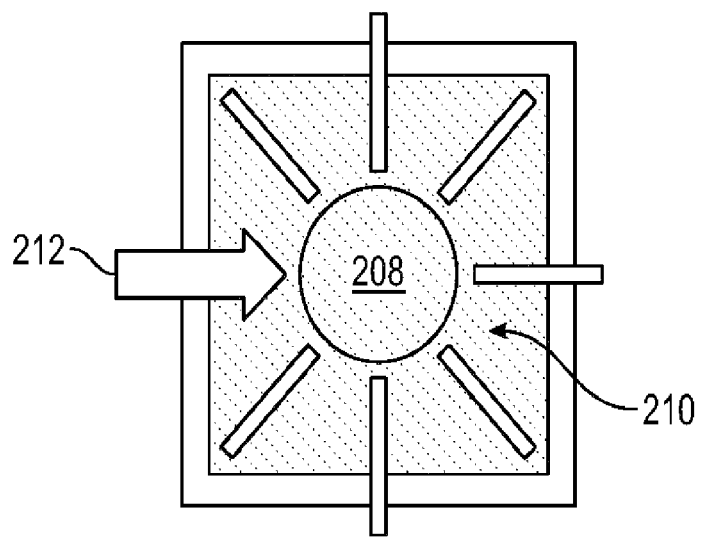
FIG. 2 schematically illustrates manufacture of quantum dots using femtosecond laser pulses and a carbon source in liquid, according to embodiments of the present disclosure.

A method of producing quantum dots is schematically shown in FIG. 2, in which quantum dot manufacture includes placing a carbon source 208 in liquid at 210, and subjecting the carbon source 208 to laser pulses 212. In some embodiments, the laser pulses are femtosecond laser pulses, and of varying intensity, wavelength, etc. depending on the characteristics that are desirable for a particular application or end-use. The carbon source 208 can include diamond nanoparticles, diamond slugs, or other materials as discussed herein that include nitrogen vacancies (e.g., N—V, N—V—N, N3), silicon vacancies, or other types of luminescent vacancy centers. In other embodiments, the carbon sources 208 may include diamond particles that have not yet been treated to form vacancies. Quantum dots may be created and thereafter the particles may be consolidated and compacted (e.g., with an HPHT process) to form vacancy centers.

The claims and all exhibits are incorporated herein as part of the original disclosure. All features described in the disclosure, including the exhibits and claims, can be combined with any other feature or component, unless expressly described as mutually exclusive. The systems and methods for making luminescent diamond as described in U.S. Patent Application Publication US2022/0056337, U.S. patent application Ser. No. 18/005,115, International Patent Application International Patent Application PCT/US2022/052223, and International Patent Application PCT/US2023/023697, each of which are herein incorporated by reference in their entirety for all purposes.

For use of the luminescent diamond as disclosed herein in certain downstream applications such as biological uses, it may be desired that the luminescent diamond particles, e.g., nanodiamond, be further treated or functionalize to adapt the material for its intended use. The manner and type of treatment that may be used to functionalize the luminescent diamond material as disclosed herein is understood to vary depending on the particular end-use application. However, an example functionalizing process may be one that involves oxygen termination along the diamond surface to render the diamond surface hydrophilic, and may be established through a range of surface oxidation procedures. Such oxygen termination functionalization may include providing a mixture of =O, —OH, —COOH, or —C—O—C-groups on the surface. Other surface terminations may include hydrogen termination, halogenation, thermal annealing to create double bonds, and reduction to OH termination. A further type of functionalization may involve the grafting or attachment of certain molecules to the surface of the diamond treated as treated in the manner noted to promote such attachment, where such molecules are selected to readily react with different biomolecules. A still further type of functionalization may include biolabeling which may take place though an electrostatic (non-covalent) or covalently bonded attachment between the diamond particle and biomolecules. These are but a few methods in which luminescent diamond as disclosed herein may be functionalized for use in biological applications, and it is to be understood that other known approaches and techniques useful for functionalizing luminescent diamond for a particular biological use is within the scope and spirit of this disclosure.

Although a few example embodiments of luminescent diamond have been described in detail above, those skilled in the art will readily appreciate that many modifications are possible in the example embodiments without materially departing from this invention. For example, luminescent diamond as disclosed herein has been presented in the context of a biological end-use application. It is to be understood that luminescent diamond as disclosed herein may be use in end-use applications other than biological where a desired improved level of luminescence intensity is useful or beneficial. Other potential uses of luminescent diamond include but are not limited to usage in magnetic sensors, high resolution thermography, microscopic sensor arrays, anti-counterfeiting measures, ion concentration monitoring, membrane potential measurement, optical trapping, and strain/pressure sensors. Therefore, it is understood that luminescent diamond as disclosed herein is not intended to be limited to one particular end use application. It should be understood that references to "one embodiment," "an embodiment," "an example" of the present disclosure or the like are not intended to be interpreted as excluding the existence of additional embodiments that also incorporate the recited features. For example, any element or feature described in relation to an embodiment herein may be combinable with any element or feature of any other embodiment described herein.

Accordingly, all such modifications and end-use applications of luminescent diamond are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke means plus function type claiming for any limitations of any of the claims herein, except for those in which the claim expressly uses the words 'means for' together with an associated function.

What is claimed is:

1. A method for making luminescent diamond comprising:
    subjecting a volume of precursor diamond grains in a presence of a pressure transfer media to a high-pressure/high-temperature condition at an elevated temperature greater than 900° C., and thereby causing the precursor diamond grains to undergo plastic deformation to produce internal vacancy defects in the precursor diamond grains to form a diamond slug; and
    subjecting a surface of the diamond slug to laser pulses and thereby forming quantum dots on the surface of the diamond slug, wherein the laser pulses are femtosecond laser pulses, and wherein a carbon source for the quantum dots includes the diamond slug,
    wherein the diamond slug including the quantum dots on the surface displays a level of luminescence intensity in one or combinations of visible, ultraviolet, infrared, or near-infrared spectrums that is greater than that of the precursor diamond grains.

2. The method of claim 1, wherein the diamond slug including the quantum dots on the surface is free of intercrystalline bonded diamond.

3. The method of claim 1, wherein the internal vacancy defects are one or more of nitrogen vacancy defects or silicon vacancy defects.

4. The method of claim 3, wherein the nitrogen vacancy defects include one or more of N—V defects, N—V—N defects, or N3 optical centers.

5. The method of claim 1, wherein subjecting the diamond slug to the laser pulses includes placing the diamond slug in liquid.

6. The method of claim 1, wherein the pressure transfer media is selected from materials that do not promote inter-crystalline diamond bonding during the high-pressure/high-temperature condition, and include one or more of carbonates, nitrates, sulfates, phosphates, chlorates, perchlorates, acetates, chromates, oxalates, sulfides, ammonium compounds, hydroxides, oxides, cyanides, cyanates, dichromates, or halides.

7. The method of claim 1, wherein the pressure transfer media is selected from a group consisting of water soluble, acid soluble, and base soluble materials.

8. The method of claim 1, wherein the pressure transfer media is a chloride.

9. The method of claim 1, wherein the internal vacancy defects are dispersed throughout the diamond slug and on the surface.

10. The method of claim 1, wherein the diamond slug comprises greater than 20 percent by volume diamond and greater than 5 percent by volume pressure transfer media based on a total volume of the luminescent diamond.

11. The method of claim 1, wherein the diamond slug comprises greater than 50 percent by volume diamond and greater than 10 percent by volume pressure transfer media based on a total volume of the luminescent diamond.

12. The method of claim 1, wherein the diamond slug comprises a total graphite content of between 5% and 15% by weight, after being made by a high-pressure/high-temperature process without further treatment.

* * * * *